(12) United States Patent
Liu

(10) Patent No.: US 12,513,881 B2
(45) Date of Patent: Dec. 30, 2025

(54) SEMICONDUCTOR STRUCTURE AND MANUFACTURING METHOD THEREOF

(71) Applicant: CHANGXIN MEMORY TECHNOLOGIES, INC., Hefei (CN)

(72) Inventor: Youming Liu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 714 days.

(21) Appl. No.: 17/816,130

(22) Filed: Jul. 29, 2022

(65) Prior Publication Data
US 2023/0389268 A1    Nov. 30, 2023

Related U.S. Application Data

(63) Continuation of application No. PCT/CN2022/097528, filed on Jun. 28, 2022.

(30) Foreign Application Priority Data

May 31, 2022 (CN) .......................... 202210610515.8

(51) Int. Cl.
*H10B 12/00* (2023.01)

(52) U.S. Cl.
CPC ............. *H10B 12/05* (2023.02); *H10B 12/30* (2023.02); *H10B 12/488* (2023.02)

(58) Field of Classification Search
CPC ...... H10B 12/05; H10B 12/30; H10B 12/488; H10B 12/315; H10D 30/031; H10D 30/6735
See application file for complete search history.

(56) References Cited

U.S. PATENT DOCUMENTS 5,386,132 A    1/1995  Wong
6,133,141 A    10/2000  Kim
(Continued)

FOREIGN PATENT DOCUMENTS

CN    1458683 A    11/2003
CN    1499639 A    5/2004
(Continued)

OTHER PUBLICATIONS

US Non Final OA in U.S. Appl. No. 17/816,435, mailed on Apr. 2, 2025.
(Continued)

*Primary Examiner* — Yara B Green
*Assistant Examiner* — Coralie A Nettles
(74) *Attorney, Agent, or Firm* — Syncoda LLC; Feng Ma

(57) ABSTRACT

The present disclosure provides a semiconductor structure and a manufacturing method thereof, and relates to the technical field of semiconductors. The manufacturing method includes: forming a first insulating layer on a substrate, a plurality of active pillars are arranged at intervals along a first direction and a second direction in the first insulating layer; partially removing the first insulating layer, to form a plurality of first trenches, each first trench exposes the substrate, and is located between two adjacent columns of active pillars; forming an isolation layer in each first trench; removing at least a part of the first insulating layer between adjacent isolation layers, to form a first filling space, the first filling space exposes a peripheral surface of a middle region of the active pillar; and forming a gate structure on the exposed peripheral surface of the active pillar, the gate structures are integrated along the second direction.

14 Claims, 15 Drawing Sheets

(56) References Cited

U.S. PATENT DOCUMENTS

| | | |
|---|---|---|
| 6,459,112 B1 | 10/2002 | Tsuboi |
| 6,756,652 B2 | 6/2004 | Yano et al. |
| 6,815,300 B2 | 11/2004 | Jeong et al. |
| 8,309,416 B2 | 11/2012 | Park et al. |
| 10,515,981 B2 | 12/2019 | Or-Bach et al. |
| 11,145,765 B2 | 10/2021 | Chung et al. |
| 11,201,213 B2 | 12/2021 | Chen |
| 11,398,492 B2 | 7/2022 | Yan et al. |
| 11,411,007 B2 | 8/2022 | Lee et al. |
| 11,723,191 B2 | 8/2023 | Choi et al. |
| 11,765,892 B2 | 9/2023 | Young et al. |
| 11,839,085 B2 | 12/2023 | Yin et al. |
| 2003/0002359 A1 | 1/2003 | Kieslich |
| 2003/0139011 A1 | 7/2003 | Cleeves et al. |
| 2005/0001253 A1 | 1/2005 | Sugimura |
| 2006/0240622 A1 | 10/2006 | Lee et al. |
| 2007/0228427 A1 | 10/2007 | Matsui et al. |
| 2012/0161229 A1 | 6/2012 | Kwon et al. |
| 2012/0168848 A1 | 7/2012 | Ahn |
| 2012/0175607 A1 | 7/2012 | Shu et al. |
| 2013/0052803 A1 | 2/2013 | Roizin et al. |
| 2013/0264621 A1 | 10/2013 | Nishi et al. |
| 2013/0320433 A1 | 12/2013 | Cho et al. |
| 2015/0228623 A1 | 8/2015 | Oh et al. |
| 2019/0103407 A1* | 4/2019 | Kim ............ H10B 12/30 |
| 2019/0198675 A1 | 6/2019 | Sharma et al. |
| 2019/0252386 A1 | 8/2019 | Lee |
| 2020/0043941 A1 | 2/2020 | Kim et al. |
| 2020/0083225 A1* | 3/2020 | Ma ............ G11C 11/401 |
| 2020/0227416 A1 | 7/2020 | Lilak et al. |
| 2020/0251151 A1 | 8/2020 | Kang et al. |
| 2020/0266113 A1 | 8/2020 | Tsugawa |
| 2020/0381450 A1 | 12/2020 | Lue et al. |
| 2021/0020747 A1 | 1/2021 | Chen |
| 2021/0151437 A1 | 5/2021 | Tomishima |
| 2021/0159229 A1 | 5/2021 | Gomes et al. |
| 2021/0257366 A1 | 8/2021 | Lee |
| 2021/0296320 A1 | 9/2021 | Sandhu |
| 2021/0375875 A1* | 12/2021 | Brewer ............ H10D 30/6757 |
| 2021/0375926 A1 | 12/2021 | Mehandru et al. |
| 2022/0005809 A1 | 1/2022 | Kim et al. |
| 2022/0028882 A1 | 1/2022 | Lee |
| 2022/0085023 A1 | 3/2022 | Shin et al. |
| 2022/0130856 A1 | 4/2022 | Kim et al. |
| 2022/0157819 A1* | 5/2022 | Jung ............ H10B 12/05 |
| 2023/0103593 A1 | 4/2023 | Sakuma et al. |
| 2023/0363143 A1 | 11/2023 | Lee et al. |
| 2023/0389261 A1 | 11/2023 | Liu |

FOREIGN PATENT DOCUMENTS

| | | |
|---|---|---|
| CN | 102034759 A | 4/2011 |
| CN | 102544016 A | 7/2012 |
| CN | 107623033 A | 1/2018 |
| CN | 108401468 A | 8/2018 |
| CN | 108428703 A | 8/2018 |
| CN | 110875315 A | 3/2020 |
| CN | 110890371 A | 3/2020 |
| CN | 112466881 A | 3/2021 |
| CN | 112838088 A | 5/2021 |
| CN | 113424319 A | 9/2021 |
| CN | 113889473 A | 1/2022 |
| CN | 113972213 A | 1/2022 |
| CN | 114334980 A | 4/2022 |
| CN | 114373760 A | 4/2022 |
| CN | 114429944 A | 5/2022 |
| CN | 114446963 A | 5/2022 |
| CN | 114497055 A | 5/2022 |
| EP | 3826058 A1 | 5/2021 |
| JP | 2005252283 A | 9/2005 |
| KR | 20090118299 A | 11/2009 |
| KR | 1020190038223 A | 4/2019 |
| KR | 1020220059424 A | 5/2022 |
| TW | 200418168 A | 9/2004 |
| TW | 201643994 A | 12/2016 |
| TW | 202118058 A | 5/2021 |
| TW | 202205539 A | 2/2022 |
| TW | 202218129 A | 5/2022 |
| WO | 2019204795 A1 | 10/2019 |

OTHER PUBLICATIONS

US Non Final OA in U.S. Appl. No. 17/816,156, mailed on Apr. 9, 2025.
US non final office action in U.S. Appl. No. 17/887,526, mailed on Apr. 11, 2025.
Extended European search report in application No. 22924572, mailed on Jul. 23, 2024.
International Search Report cited in PCT/CN2022/098247 mailed Dec. 19, 2022, 9 pages.
International Search Report cited in PCT/CN2022/098020 mailed Dec. 19, 2022, 9 pages.
International Search Report cited in PCT/CN2022/098018 mailed Dec. 28, 2022, 8 pages.
International Search Report cited in PCT/CN2022/098017 mailed Dec. 19, 2022, 9 pages.
International Search Report cited in PCT/CN2022/097528 mailed Dec. 16, 2022, 8 pages.
International Search Report cited in PCT/CN2022/098249 mailed Dec. 26, 2022, 9 pages.
US office action in U.S. Appl. No. 17/813,409, mailed on Jul. 5, 2025.
X. Duan et al., "Novel Vertical Channel-All-Around(CAA) In—Ga—Zn—O FET for 2T0C-DRAM With Density Beyond 4F2 by Monolithic Stacking," in IEEE Transactions on Electron Devices, vol. 69, No. 4, pp. 2196-2202, Apr. 2022.
US office action in U.S. Appl. No. 17/816,435, mailed on Aug. 22, 2025.

* cited by examiner

E-E

F-F

SEMICONDUCTOR STRUCTURE AND MANUFACTURING METHOD THEREOF

CROSS-REFERENCE TO RELATED APPLICATIONS

The present disclosure is a continuation application of International Patent Application No. PCT/CN2022/097528, filed on Jun. 8, 2022, which claims the priority to Chinese Patent Application 202210610515.8, titled "SEMICONDUCTOR STRUCTURE AND MANUFACTURING METHOD THEREOF" and filed with the China National Intellectual Property Administration (CNIPA) on May 31, 2022. The entire contents of International Patent Application No. PCT/CN2022/097528 and Chinese Patent Application 202210610515.8 are incorporated herein by reference.

TECHNICAL FIELD

The present disclosure relates to the technical field of semiconductors, and in particular to a semiconductor structure and a manufacturing method thereof.

BACKGROUND

With the development of semiconductor technologies, the memory, especially, a dynamic random-access memory (DRAM) is widely used in various electronic devices due to its high storage density and fast reading and writing speed.

The DRAM usually includes a plurality of memory cells. Each memory cell includes a transistor and a capacitor. A gate of the transistor is electrically connected to a word line (WL) of the DRAM. The on and off of the transistor is controlled by the voltage on the WL. One of a source and a drain of the transistor is electrically connected to a bit line (BL), and the other is electrically connected to the capacitor. Data information is stored or outputted by the BL.

To reduce the size of the memory and increase its storage density, the capacitor is usually placed horizontally, which facilitates manufacturing a capacitor with a larger slenderness ratio. Correspondingly, the transistors are also placed horizontally. An insulating structure is usually disposed between the gates of transistors to isolate adjacent gates. However, as the quantity of layers of the horizontally stacked transistors increases, the insulating structure between adjacent gates also becomes increasingly high. As a result, the insulating structure is likely to collapse, and the stability of the semiconductor structure is poor.

SUMMARY

According to some embodiments, a first aspect of the present disclosure provides a manufacturing method of a semiconductor structure, including:
  forming a first insulating layer on a substrate, where a plurality of active pillars are arranged at intervals along a first direction and a second direction in the first insulating layer, and the plurality of active pillars extend along a third direction;
  partially removing the first insulating layer, to form a plurality of first trenches extending along the third direction, where each of the first trenches exposes the substrate, and is located between two adjacent columns of active pillars along the first direction;
  forming an isolation layer in each of the first trenches;
  removing at least a part of the first insulating layer between adjacent isolation layers, to form a first filling space, where the first filling space exposes a peripheral surface of a middle region of the active pillar; and
  forming a gate structure on the peripheral surface of the active pillar exposed in the first filling space, where the gate structures are integrated along the second direction.

DETAILED DESCRIPTION

Figure 1:
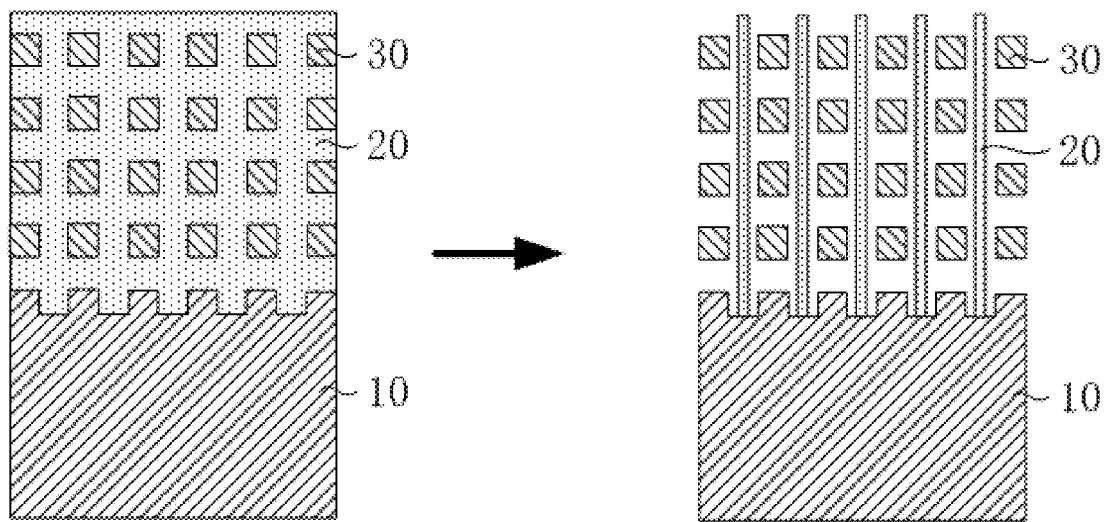
FIG. 1 is a flowchart of forming an insulating structure of a semiconductor structure in the related art.
Figure 2:
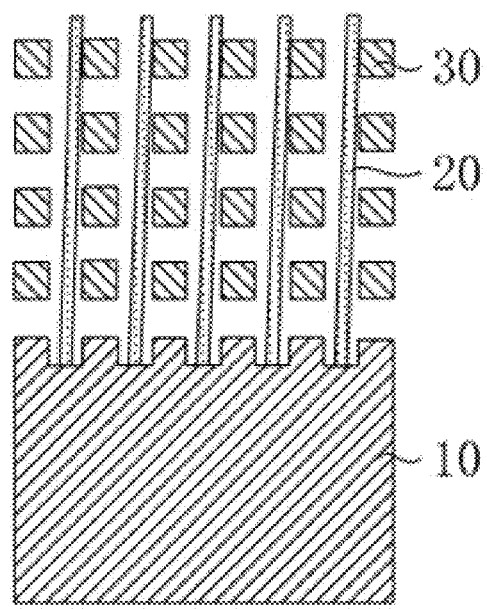
FIG. 2 is a schematic diagram in which the insulating structure of the semiconductor structure collapses in the related art.

In the related art, due to the poor mechanical property, the insulating structure of the semiconductor structure is likely to collapse, and therefore the stability of the semiconductor structure is poor. With reference to FIG. 1, when the semiconductor structure is manufactured, an insulating structure 20 is usually formed on an active pillar 30. The insulating structure 20 covers the active pillar 30, and they are integrated, to insulate and separate the active pillars 30. Then, the insulating structure 20 is partially removed, to divide it into a plurality of ones. Each insulating structure 20 is located between two adjacent columns of active pillars 30. As shown in FIG. 1, the insulating structure 20 is relatively thin and has the poor mechanical property, and therefore is prone to collapse and deformation, which affects the stability of the semiconductor structure. In addition, with reference to FIG. 2, when the insulating structure 20 collapses, it tends to be in contact with the active pillar 30, and it is difficult for the active pillar 30 to smoothly form a desired structure (for example, a transistor), which affects the performance of the semiconductor structure.

In view of this, the embodiments of the present disclosure provide a semiconductor structure and a manufacturing method thereof. The insulating layer is formed between two adjacent columns of active pillars along the first direction, to separate them, thereby separating the gate structures, on the peripheral surfaces of the active pillars, integrated along the second direction. In addition, the material of the isolation layer is adjusted, to reduce the collapsing possibilities of the isolation layer, thereby improving the stability of the semiconductor structure.

To make the objectives, features and advantages of the embodiments of the present disclosure clearer, the technical solutions in the embodiments of the present disclosure are described clearly and completely below with reference to the drawings in the embodiments of the present disclosure. Apparently, the described embodiments are merely some rather than all of the embodiments of the present disclosure. All other embodiments obtained by those of ordinary skill in the art based on the embodiments of the disclosure without creative efforts shall fall within the protection scope of the present disclosure.

Figure 3:
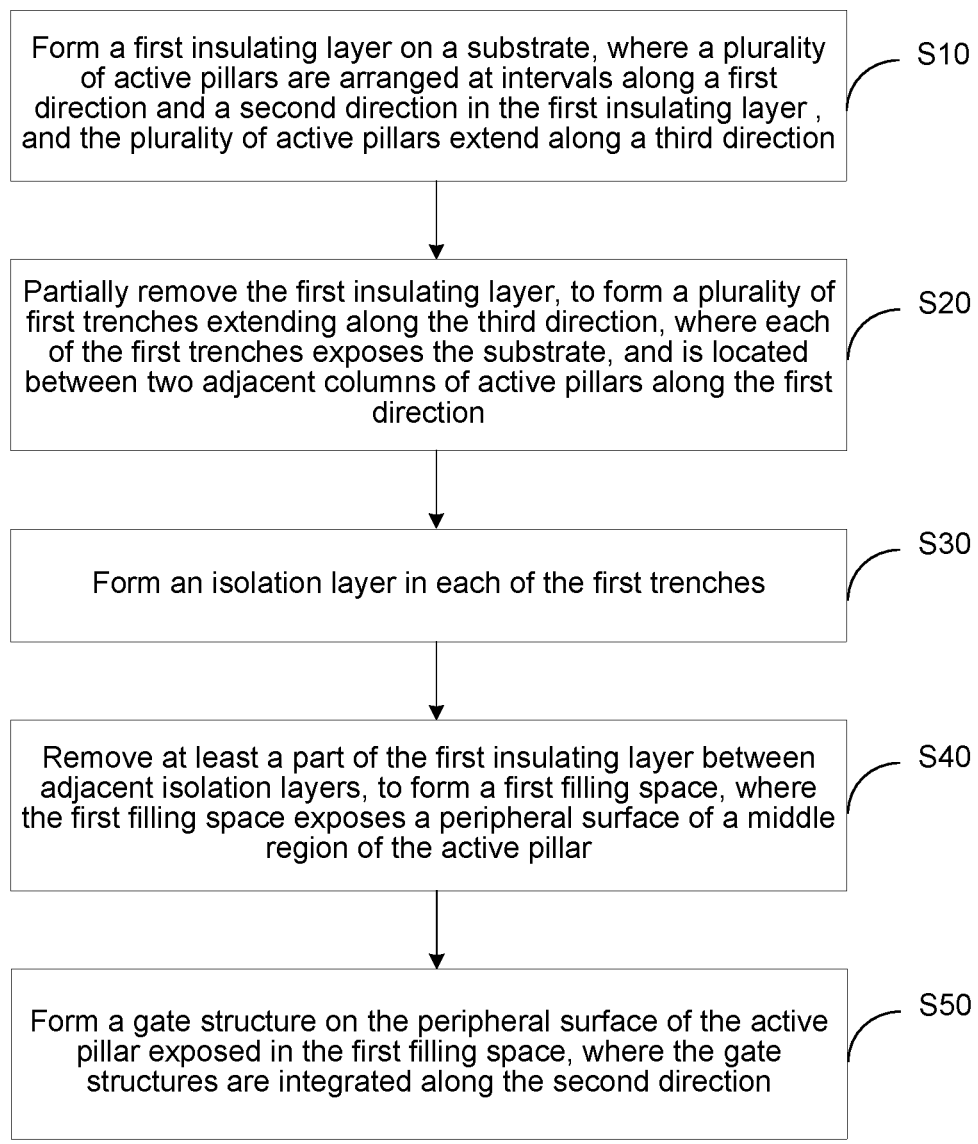
FIG. 3 is a flowchart of a manufacturing method of a semiconductor structure according to an embodiment of the present disclosure.

FIG. 3 is a flowchart of a manufacturing method of a semiconductor structure according to an embodiment of the present disclosure. The manufacturing method includes the following steps:

Step S10: Form a first insulating layer on a substrate, where a plurality of active pillars are arranged at intervals along a first direction and a second direction in the first insulating layer, and the plurality of active pillars extend along a third direction.

Figure 4:
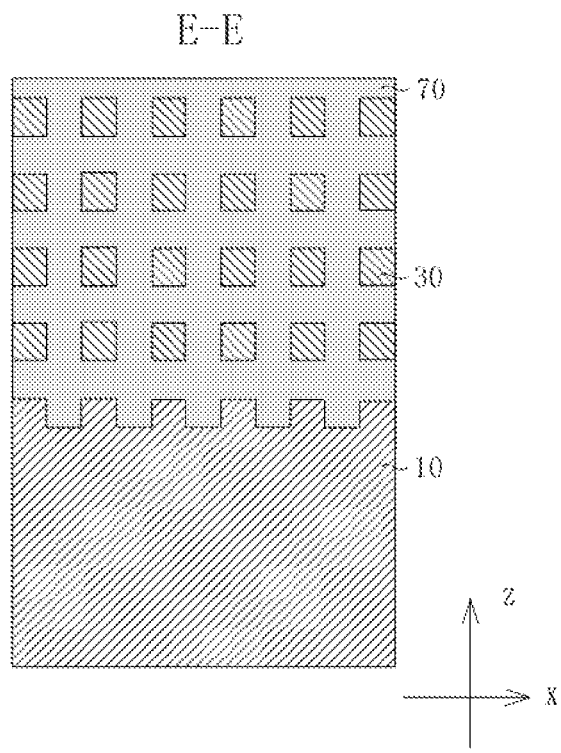
FIG. 4 is a schematic diagram of a cross section taken along E-E after a first insulating layer is formed according to an embodiment of the present disclosure.
Figure 5:
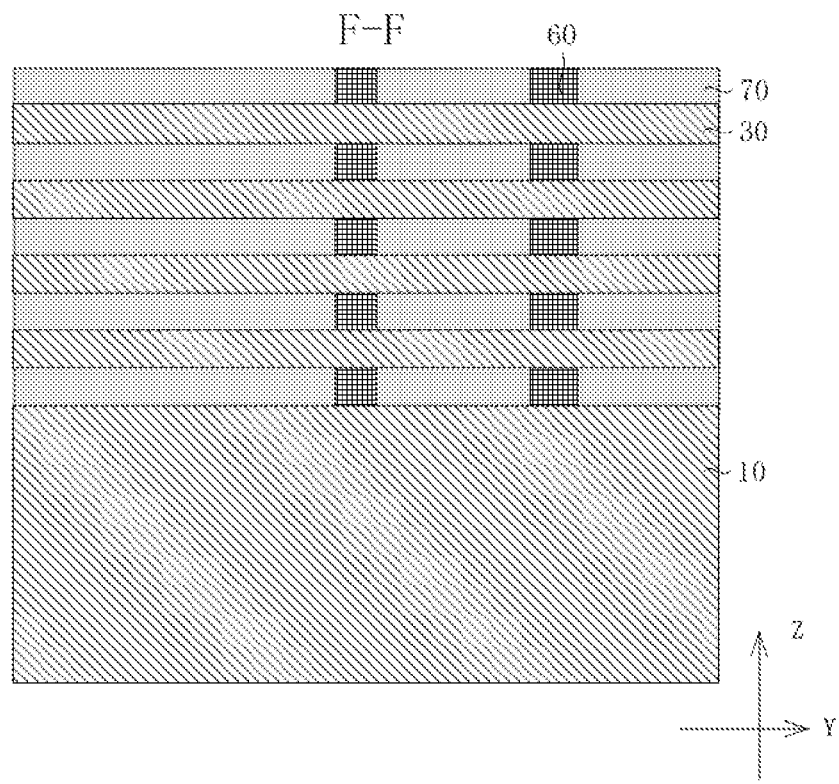
FIG. 5 is a schematic diagram of a cross section taken along F-F after a first insulating layer is formed according to an embodiment of the present disclosure.

With reference to FIGS. 4 and 5, the section E-E in FIG. 4 is perpendicular to the third direction, and the section F-F in FIG. 5 is parallel to the second direction and passes through the transistor. The substrate 10 can support the structure layers thereon and may be made of a semiconductor such as monocrystalline silicon, polycrystalline silicon, amorphous silicon, germanium, silicon carbide, silicon germanium, germanium on insulator (GOI) or silicon on insulator (SOI).

A first insulating layer 70 is formed on the substrate 10. A plurality of active pillars 30 are arranged at intervals in the first insulating layer 70. The active pillar 30 can subsequently form a transistor 2 (refer to FIG. 17). As shown in FIG. 4, the plurality of active pillars 30 are in the first insulating layer 70. The first insulating layer 70 fills a space between adjacent active pillars 30, and therefore separating them. In some possible examples, the first insulating layer 70 covers the plurality of active pillars 30. The surface of the first insulating layer 70 away from the substrate 10 is higher than that of the active pillar 30 away from the substrate 10, such that the plurality of active pillars 30 are located in the first insulating layer 70. The material of the first insulating layer 70 may be an oxide, such as silicon oxide, to facilitate the subsequent removal of the first insulating layer 70.

With reference to FIGS. 4 and 5, the plurality of active pillars 30 extend along the third direction and are arranged in an array. The plurality of active pillars 30 are arranged at intervals in both the first direction and the second direction. The two directions cross each other, and are both perpendicular to the third direction. The third direction is the direction parallel to the substrate 10, that is, the direction Y shown in FIG. 5. The second direction is the direction perpendicular to the substrate 10, that is, the direction Z shown in FIG. 5.

Any two of the first direction, the second direction, and the third direction are perpendicular to each other. For example, the first direction is the direction Z in FIG. 4. Though such a disposal, the plurality of active pillars 30 can be arranged more compact in a better manner, and the arrangement quantity of the active pillars 30 can be maximized, thereby improving storage density of the semiconductor structure.

In some possible embodiments, the active pillar 30 includes a source, a drain, and a channel located between the source and the drain, that is, the source, the channel, and the drain are arranged sequentially along the third direction. It can be understood that the source and the drain are located at two ends of the active pillar 30 respectively. One of the source and the drain is electrically connected to the BL 1 (refer to FIG. 17), and the other is electrically connected to the capacitor 3 (refer to FIG. 17). The channel is located in the middle region of the active pillar 30.

Step S20: Partially remove the first insulating layer, to form a plurality of first trenches extending along the third direction, where each of the first trenches exposes the substrate, and is located between two adjacent columns of active pillars along the first direction.

Figure 6:
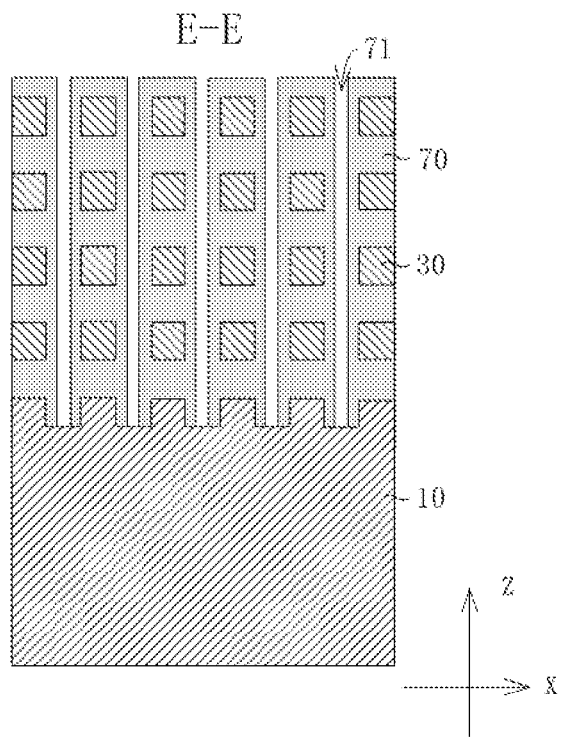
FIG. 6 is a schematic diagram of a cross section taken along E-E after a first trench is formed according to an embodiment of the present disclosure.
Figure 7:
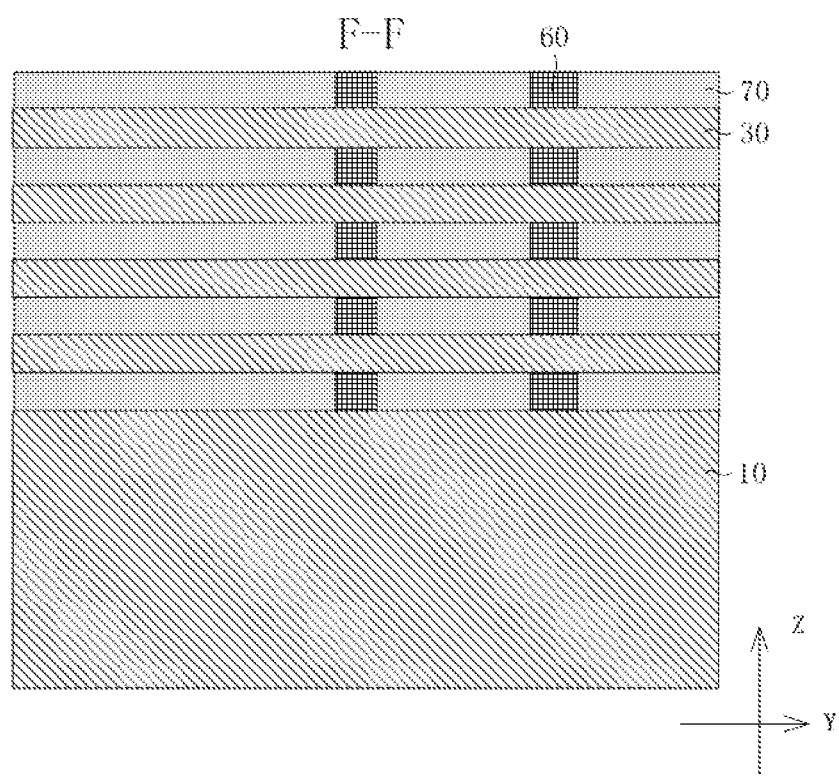
FIG. 7 is a schematic diagram of a cross section taken along F-F after the first trench is formed according to an embodiment of the present disclosure.

With reference to FIGS. 6 and 7, the first insulating layer 70 is partially removed through wet or dry etching to form the first trench 71. The plurality of first trenches 71 are provided and arranged at intervals, do not communicate with each other, and do not expose the active pillar 30. The first trench 71 exposes the substrate 10, and is located between two adjacent columns of active pillars 30. The two columns of active pillars 30 are arranged along the first direction. As shown in FIG. 6, the first trench 71 is located between two adjacent columns of active pillars 30 on the left and right.

The plurality of first trenches 71 and the active pillar 30 both extend along the third direction. In some possible embodiments, along the third direction, the first trench 71 may be as long as the active pillar 30, that is, the first trench 71 divides the first insulating layer 70 into a plurality of ones. In some other possible embodiments, along the third direction, the first trench 71 may be shorter than the active pillar 30. The first trench 71 is at least opposite to the middle region of the active pillar 30, that is, the first trench 71 is at least opposite to the channel. The first trench 71 may extend to the source/drain.

In some possible implementations, the step of partially removing the first insulating layer 70, to form the plurality of first trenches 71 extending along the third direction, where each of the first trenches 71 exposes the substrate 10, and is located between two adjacent columns of active pillars 30 along the first direction includes:

forming a second photoresist layer on the first insulating layer 70, where the second photoresist layer is provided with a second pattern, and the second pattern includes a plurality of second etched trenches extending along the third direction. For example, the second photoresist layer is coated on the first insulating layer 70, and a required second pattern is formed in the second photoresist layer by developing and exposing the second photoresist layer. The second pattern includes a plurality of second etched trenches arranged at intervals. The second etch trenches extend along the third direction and partially expose the first insulating layer 70.

After the second photoresist layer is formed, the first insulating layer 70 is etched by the second photoresist layer as a mask, to form the first trench 71. The first insulating layer 70 that is not covered by the second photoresist layer is etched and removed by the second photoresist layer as a mask. The first insulating layer 70 covered by the second photoresist layer is retained. The first trench 71 is formed in the first insulating layer 70.

It should be noted that when the second photoresist layer is used as a mask to etch the first insulating layer 70, the second photoresist layer is also removed. In some possible examples, during the etching on the first insulating layer 70, the second photoresist layer is completely removed, and therefore the second photoresist layer does not need to be removed separately. In some other possible examples, after the first insulating layer 70 is etched, the second photoresist layer partially remains. In this case, the second photoresist layer needs to be removed separately through, for example, an ashing process, to expose the first insulating layer 70.

Step S30: Form an isolation layer in each of the first trenches.

Figure 8:
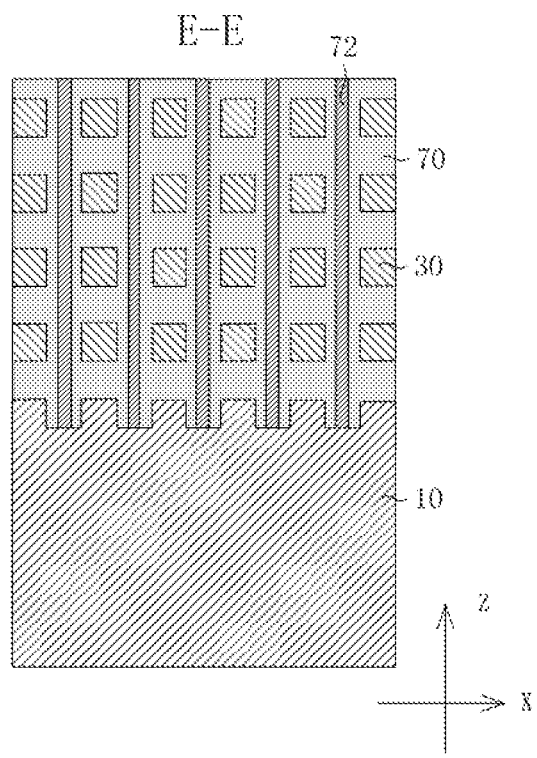
FIG. 8 is a schematic diagram of a cross section taken along E-E after an isolation layer is formed according to an embodiment of the present disclosure.
Figure 9:
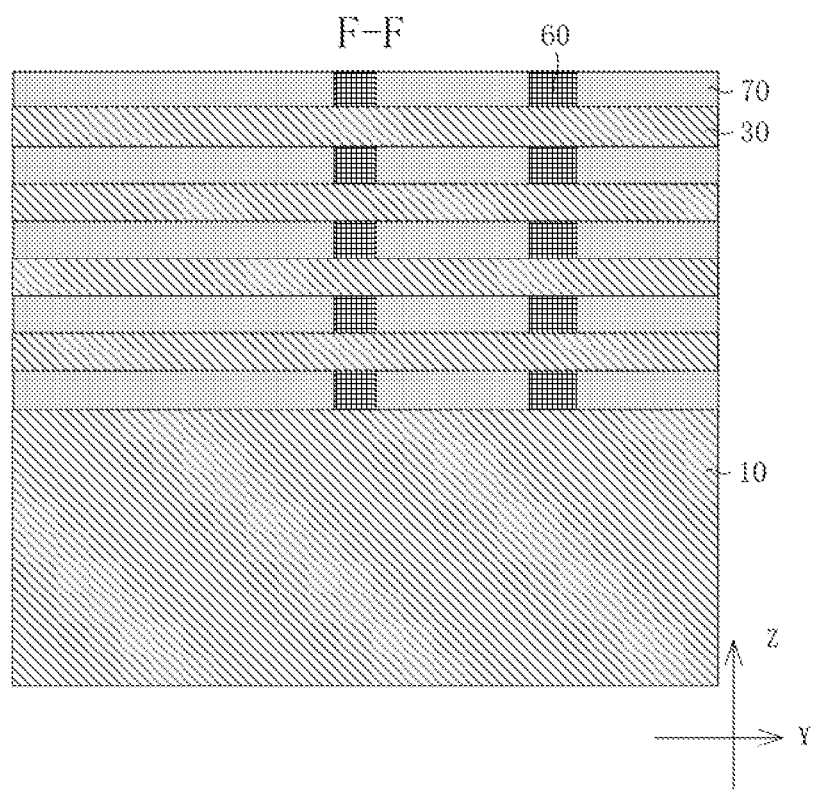
FIG. 9 is a schematic diagram of a cross section taken along F-F after the isolation layer is formed according to an embodiment of the present disclosure.

With reference to FIGS. 7 to 9, the isolation layer 72 fills the first trench 71. For example, the isolation layer 72 is formed through a deposition process, such as chemical vapor deposition (CVD), physical vapor deposition (PVD), or atomic layer deposition (ALD).

In some possible implementations, the step of forming the isolation layer 72 in the first trench 71 includes:

depositing the isolation layer 72 in each of the first trenches 71 and on the first insulating layer 70, where the isolation layer 72 fills up the first trench 71 and covers a surface of the first insulating layer 70 away from the substrate 10. The isolation layer 72 fills up the first trench 71 and covers the first insulating layer 70, to form the isolation layer 72. Because the material of the isolation layer 72 is relatively tough, and includes, for example, silicon nitride or silicon oxynitride, the isolation layer has a better mechanical property, and is unlikely to collapse, and the semiconductor structure has a better stability. After the isolation layer 72 is deposited, the surface of the isolation layer 72 away from the substrate 10 is flattened to expose the first insulating layer 70. As shown in FIG. 8, the isolation layer 72 is flattened, and the isolation layer 72 located on first insulating layer 70 is removed to expose the first insulating layer 70. For example, a surface of the isolation layer 72 away from the substrate 10 is polished through chemical mechanical polishing (CMP).

Step S40: Remove at least a part of the first insulating layer between adjacent isolation layers, to form a first filling space, where the first filling space exposes a peripheral surface of a middle region of the active pillar.

Figure 10:
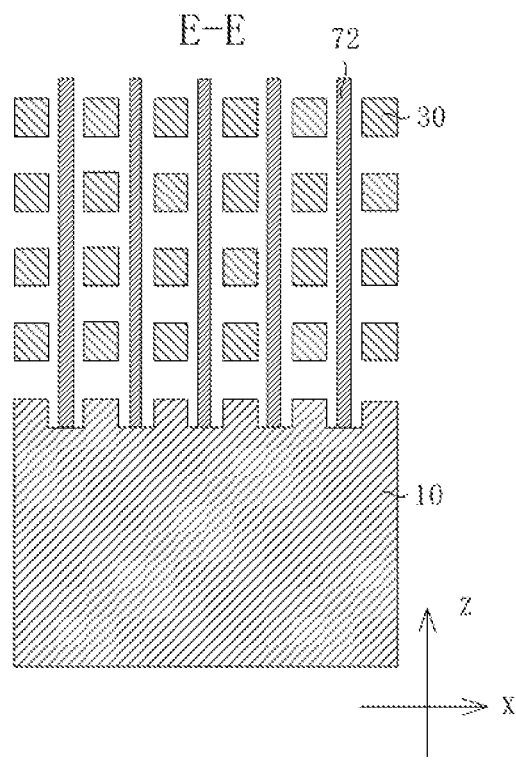
FIG. 10 is a schematic diagram of a cross section taken along E-E after a first filling space is formed according to an embodiment of the present disclosure.
Figure 11:
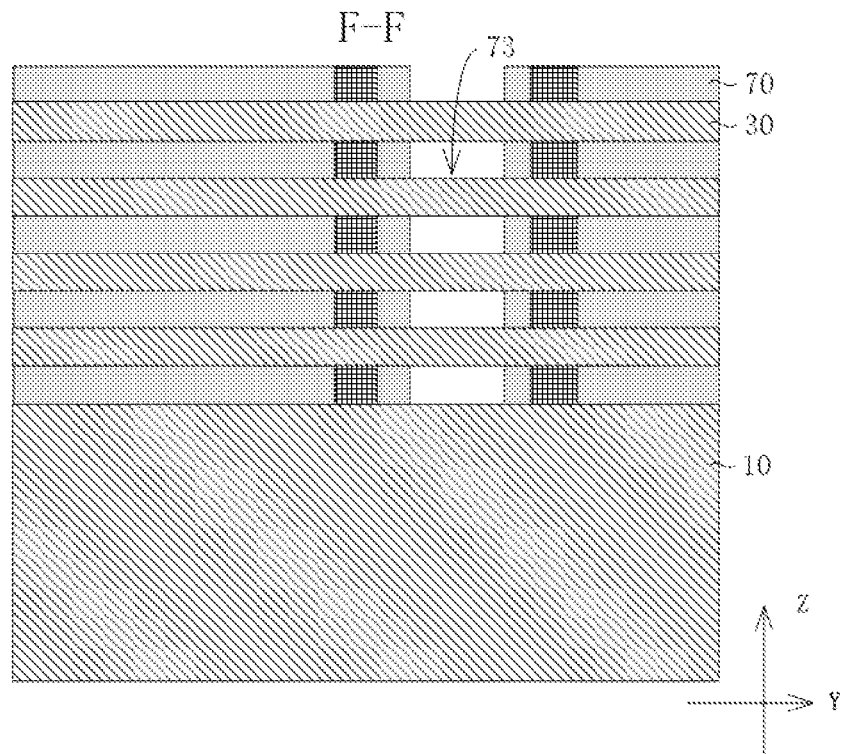
FIG. 11 is a schematic diagram of a cross section taken along F-F after the first filling space is formed according to an embodiment of the present disclosure.

With reference to FIGS. 10 and 11, after the isolation layer 72 is formed, the isolation layer 72 can insulate and isolate two adjacent columns of active pillars 30 along the third direction. In this case, at least a part of the first insulating layer 70 between adjacent isolation layers 72 may be removed, to form a first filling space 73. The peripheral surface of the middle region of the active pillar 30 is exposed in the first filling space 73. The middle region of the active pillar 30 includes the channel of the active region, that is, the first filling space 73 exposes the peripheral surface of the channel, to form the gate structure 80 on the peripheral surface of the channel.

Specifically, in the embodiment in which along the third direction, the first trench 71 is as long as the active pillar 30, a part of the first insulating layer 70 located between the adjacent isolation layers 72 is removed, and the part of the first insulating layer 70 is opposite to the channel. In other words, the removed first insulating layer 70 is shorter than the isolation layer 72 along the third direction. The remaining parts of first insulating layer 70 are located at two ends of the isolation layer 72 along the third direction, to prevent the gate structure from being formed on the entire active pillar 30.

In the embodiment in which along the third direction, the first trench 71 is shorter than the active pillar 30, the first insulating layer 70 located between the adjacent isolation layers 72 is removed partially or completely, to expose the channel. The isolation layer 72 is disposed between adjacent channels, to subsequently insulate and isolate the gate structures in the channels.

Step S50: Form a gate structure on the peripheral surface of the active pillar exposed in the first filling space, where the gate structures are integrated along the second direction.

With reference to FIGS. 10 to 13, the gate structure 80 includes a gate dielectric layer 81 and a gate conductive layer 82. The gate dielectric layer 81 covers the peripheral surface of the active pillar 30. The gate conductive layer 82 covers the peripheral surface of the gate dielectric layer 81. The gate conductive layers 82 are integrated along the second direction, to form the WL 4. The material of the gate dielectric layer 81 may include an oxide. The material of the gate conductive layer 82 may include a material with a small resistance, such as W, TiN, TaN, Al, Ru, or Cu.

In some possible implementations, the step of forming the gate structure 80 in the first filling space 73 and on the peripheral surface of the active pillar 30, where the gate structures 80 are integrated along the second direction includes:

forming a gate dielectric layer 81 on the peripheral surface of the active pillar 30, where gaps are formed between the gate dielectric layers 81 and between the gate dielectric layer 81 and the isolation layer 72. For example, the gate dielectric layer 81 is formed on the exposed peripheral surface of the active pillar 30 through a deposition process. The gate dielectric layer 81 covers the active pillar 30. In addition, the gate dielectric layers 81 are spaced apart, and the gate dielectric layer 81 and the isolation layer 72 are also spaced apart from each other.

Figure 12:
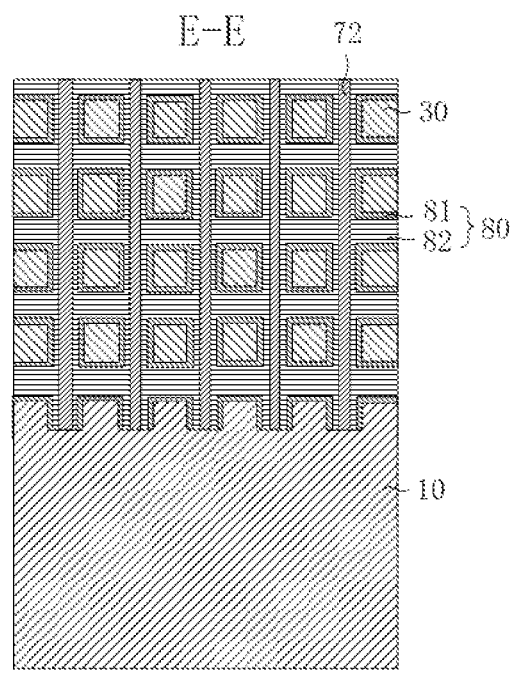
FIG. 12 is a schematic diagram of a cross section taken along E-E after a gate structure is formed according to an embodiment of the present disclosure.
Figure 13:
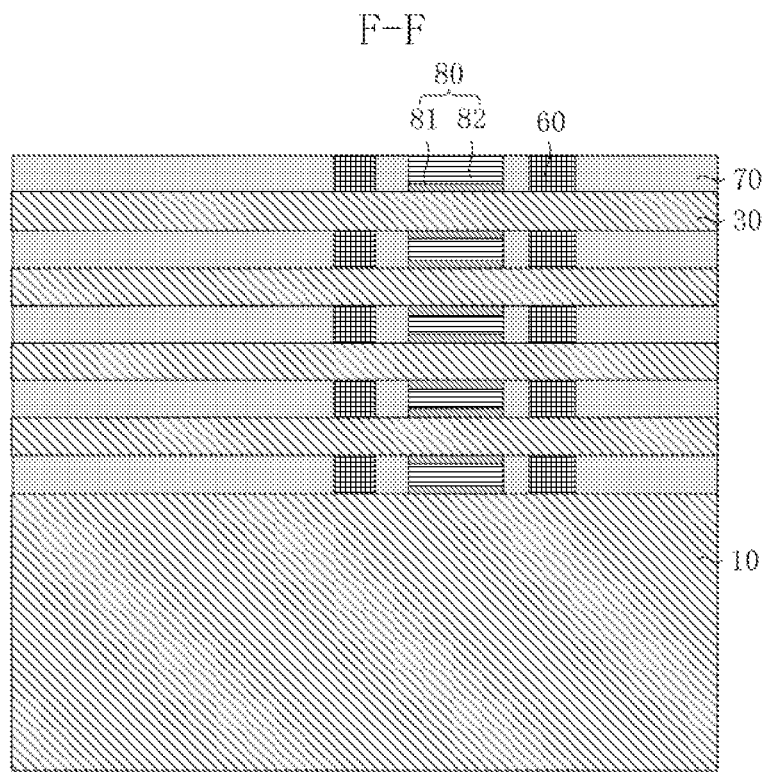
FIG. 13 is a schematic diagram of a cross section taken along F-F after the gate structure is formed according to an embodiment of the present disclosure.

The gate conductive layer 82 is formed in the remaining first filling space 73, and the gate dielectric layer 81 and the gate conductive layer 82 form the gate structure 80. As shown in FIGS. 11 to 13, the gate conductive layer 82 fills up the remaining first filling space 73, and the gate conductive layers 82 extend and are integrated along the second direction. The gate conductive layer 82 is used as the WL 4. On the one hand, on the basis that the substrate 10 of the same size is occupied, the integration of the semiconductor structure can be improved. On the other hand, the gate conductive layer 82 surrounds the channel, which can also improve the channel control ability of the gate conductive layer 82 and improve the performance of the semiconductor structure.

Figure 14:
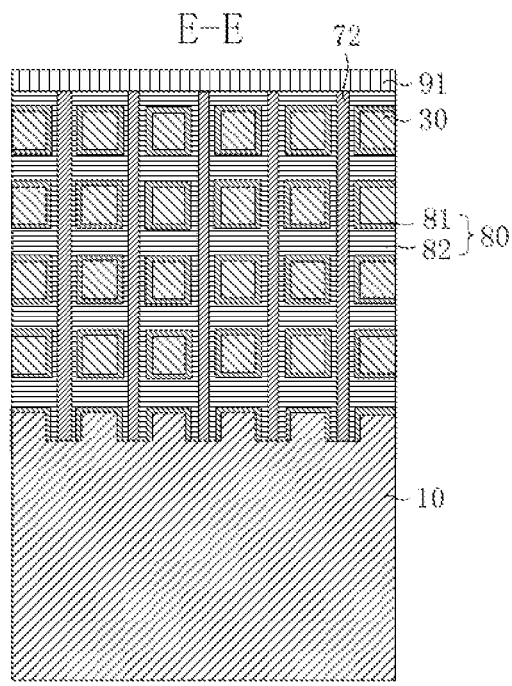
FIG. 14 is a schematic diagram of a cross section taken along E-E after a protective layer is formed according to an embodiment of the present disclosure.
Figure 15:
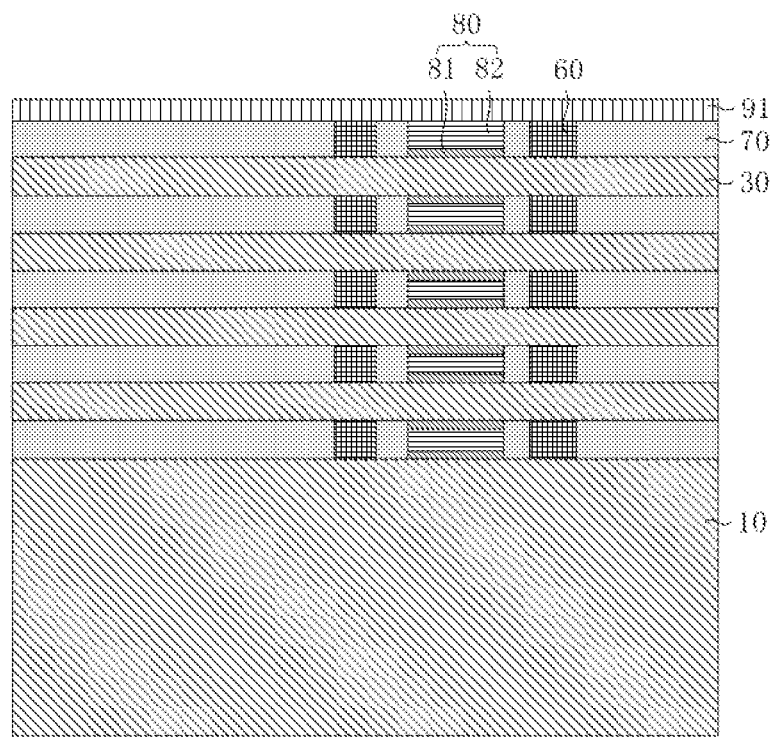
FIG. 15 is a schematic diagram of a cross section taken along F-F after the protective layer is formed according to an embodiment of the present disclosure.
Figure 16:
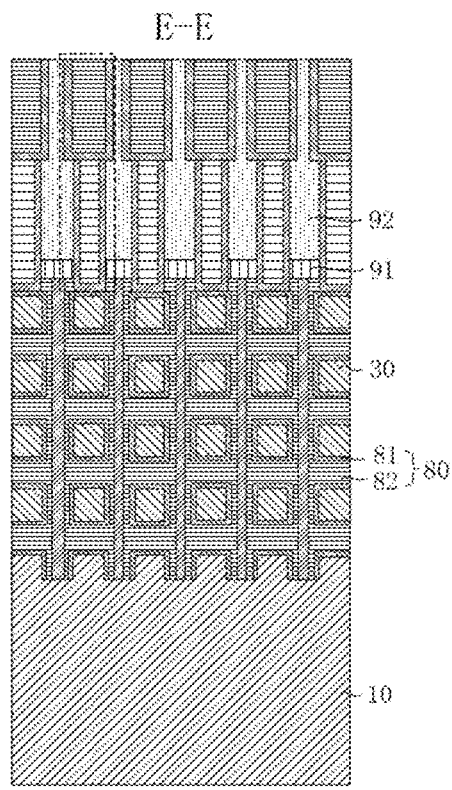
FIG. 16 is a schematic diagram of a cross section taken along E-E after a WL plug is formed according to an embodiment of the present disclosure.
Figure 17:
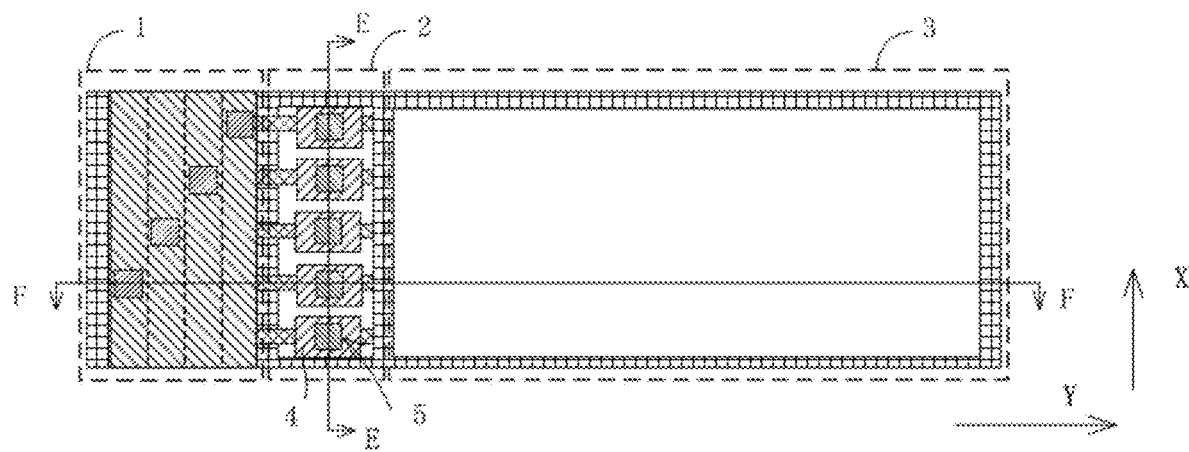
FIG. 17 is a frame diagram of a semiconductor structure according to an embodiment of the present disclosure.

In some possible embodiments, with reference to FIGS. 14 to 17, after the forming the gate structure 80 in the first filling space 73 and on the peripheral surface of the active pillar 30, where the gate structures 80 are integrated along the second direction, the method further includes:

forming a protective layer 91 on the gate structure 80, the first insulating layer 70, and the isolation layer 72, and forming a second insulating layer 92 on the protective layer 91. As shown in FIGS. 14 and 15, the protective layer 91 covers the gate structure 80, the first insulating layer 70, and the isolation layer 72. With reference to FIGS. 16 and 17, the second insulating layer 92 covers the protective layer 91. On the one hand, the protective layer 91 can isolate and protect the gate structure 80, to reduce or prevent oxidation of the gate structure 80. On the other hand, the protective layer can be further used as an etching stop layer for the second insulating layer 92, to reduce or prevent the damages on the gate structure 80 during the etching. The material of the second insulating layer 92 may be silicon oxide, and the material of the protective layer 91 may be silicon nitride or silicon oxynitride.

After the second insulating layer 92 is formed, the second insulating layer 92 and the protective layer 91 are etched to form a plurality of WL plug holes arranged at intervals. Each of the WL plug holes exposes one gate structure 80. Specifically, the second insulating layer 92 and the protective layer 91 are wet-etched or dry-etched to form the WL plug holes. The WL plug holes penetrate through the second insulating layer 92 and the protective layer 91, to expose the gate structures 80. The plurality of WL plug holes correspond to the plurality of gate structures 80 one by one.

After the WL plug holes are formed, a WL plug 5 is formed in the WL plug hole. The WL plugs 5 are electrically connected to the gate structures 80 in a one-to-one correspondence. With reference to FIGS. 16 and 17, one WL plug 5 is formed in each WL plug hole. The WL plug 5 is electrically connected to a corresponding gate structure 80.

In conclusion, in the manufacturing method of a semiconductor structure provided by the embodiments of the present disclosure, the first insulating layer 70 located between two adjacent columns of active pillars 30 is partially removed along the first direction, to form the first trench 71 exposing the substrate 10. Further, the isolation layer 72 is formed in the first trench 71, and separates two adjacent columns of active pillars 30, thereby separating the gate structures 80, on the peripheral surfaces of the active pillars 30, integrated along the second direction. In addition, the material of the isolation layer 72 is adjusted, to reduce the possibilities that the isolation layer 72 collapses, thereby improving the stability of the semiconductor structure.

Figure 18:
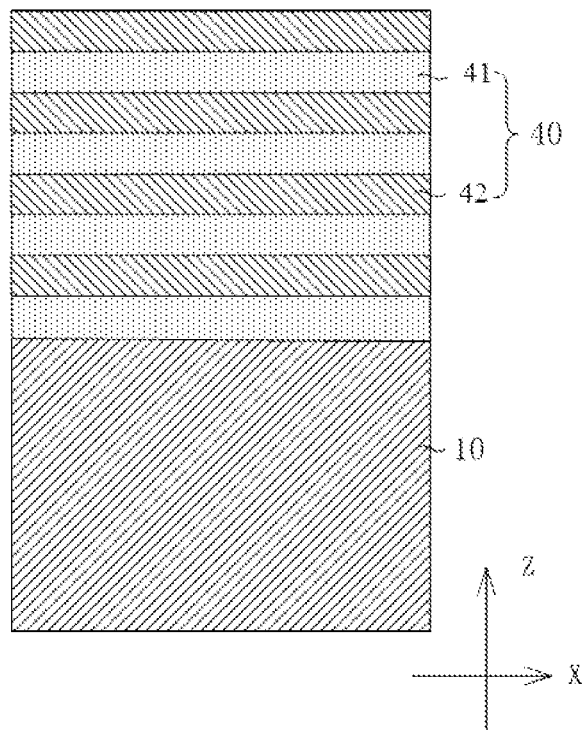
FIG. 18 is a schematic diagram of a cross section taken along E-E after a stacked structure is formed according to an embodiment of the present disclosure.
Figure 19:
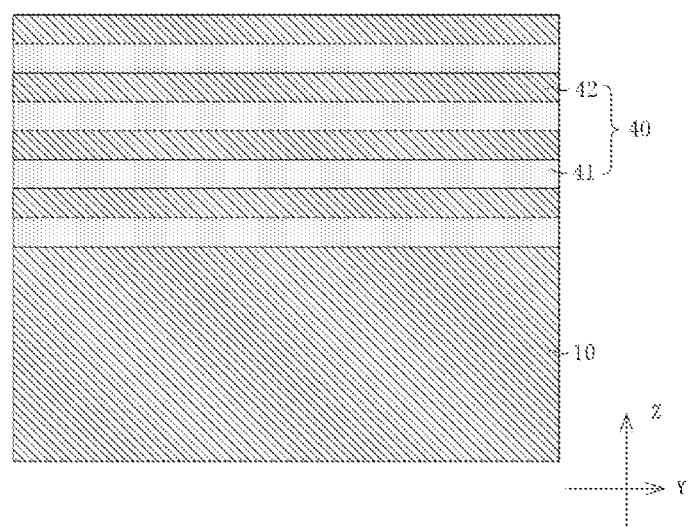
FIG. 19 is a schematic diagram of a cross section taken along F-F after the stacked structure is formed according to an embodiment of the present disclosure.

With reference to FIGS. 18 to 19, in a possible embodiment of the present application, the step of forming the first insulating layer 70 on the substrate 10, where the plurality of active pillars 30 arranged at intervals in the first insulating layer 70 along the first direction and the second direction, and the plurality of active pillars 30 extend along the third three direction (step S10) includes the following steps:

Step S11: Form a stacked structure 40 on the substrate 10, where the stacked structure 40, includes a first sacrificial layer 41 and an active layer 42 that are disposed alternately along the second direction.

With reference to FIGS. 18 and 19, the stacked structure 40 includes a plurality of first sacrificial layers 41 and a plurality of active layers 42. The plurality of first sacrificial layers 41 and the plurality of active layers 42 are stacked alternately along the second direction. The second direction is the direction perpendicular to the substrate 10, that is, the direction Z shown in FIG. 18. Along the second direction, the active layer 42 is disposed between two adjacent first sacrificial layers 41, or the first sacrificial layer 41 is disposed between two adjacent active layers 42, such that the first sacrificial layers 41 and the active layers 42 are disposed alternately. In this arrangement, two adjacent active layers 42 can be isolated by the first sacrificial layer 41, to electrically isolate the first active layers 42 along the first direction.

Specifically, an innermost layer in the stacked structure 40 close to the substrate 10 the first sacrificial layer 41, and an outermost layer in the stacked structure 40 away from the substrate 10 is the active layer 42. In this way, on the one hand, the innermost first sacrificial layer 41 can separate the active layer 42 on the first sacrificial layer 41 from the substrate 10, and therefore, each active layer 42 can form the active pillars 30 subsequently, thereby increasing the storage capacity of the semiconductor structure. On the other hand, when the stacked structures 40 have the same quantity of active layers 42, the height of the stacked structure 40 is reduced to facilitate the subsequent etching of the stacked structure 40.

In some possible implementations, the first sacrificial layer 41 and the active layer 42 may be formed on the substrate 10 through an epitaxy process. Specifically, the substrate 10, the active layer 42, and the first sacrificial layer 41 are made of the same element, such as the silicon element, such that the first sacrificial layer 41 is epitaxially formed on the substrate 10, the active layer 42 is epitaxially formed on the first sacrificial layer 41, and the first sacrificial layer 41 is epitaxially formed on the active layer 42. For example, the material of the substrate 10 includes silicon. The material of the active layer 42 includes silicon. The material of the first sacrificial layer 41 includes silicon germanium. In this way, the active layer 42 and the first sacrificial layer 41 are epitaxially formed. Further, the first sacrificial layer 41 and the active layer 42 each have a larger selectivity ratio, and the first sacrificial layer 41 may be subsequently removed separately to reduce damage on the active layer 42 when the first sacrificial layer 41 is removed. In some embodiments, the material of the active layer 42 includes doped silicon. For example, the material of the active layer 42 includes N-type doped silicon, to improve the electrical performance of the active layer 42.

Step S12: Etch the stacked structure 40, to form a plurality of second trenches 43 arranged at intervals and extending along the third direction, where the second trenches 43 expose the substrate 10, and divide the active layer 42 into the plurality of active pillars 30.

Figure 20:
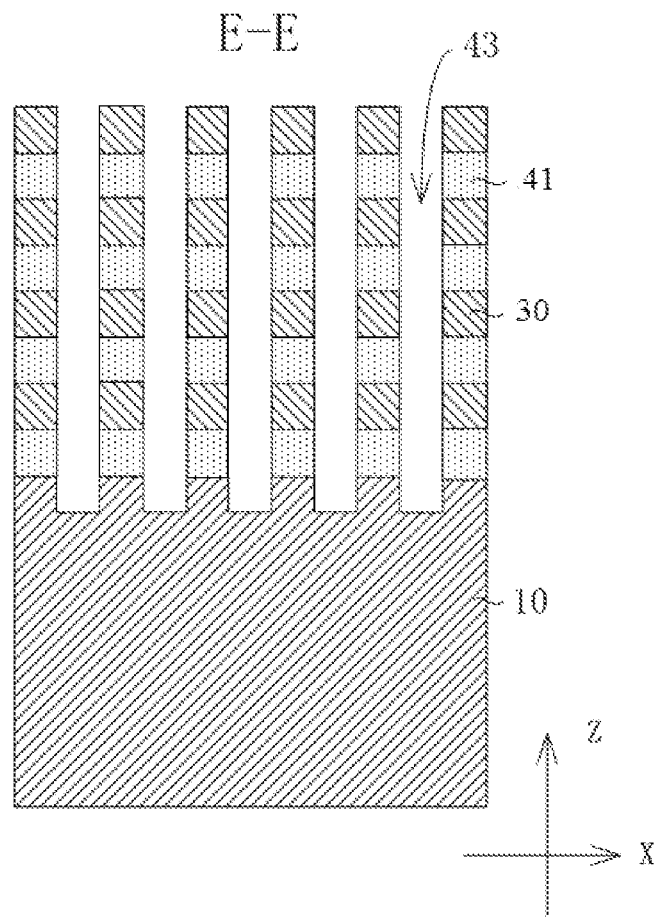
FIG. 20 is a schematic diagram of a cross section taken along E-E after a second trench is formed according to an embodiment of the present disclosure.
Figure 21:
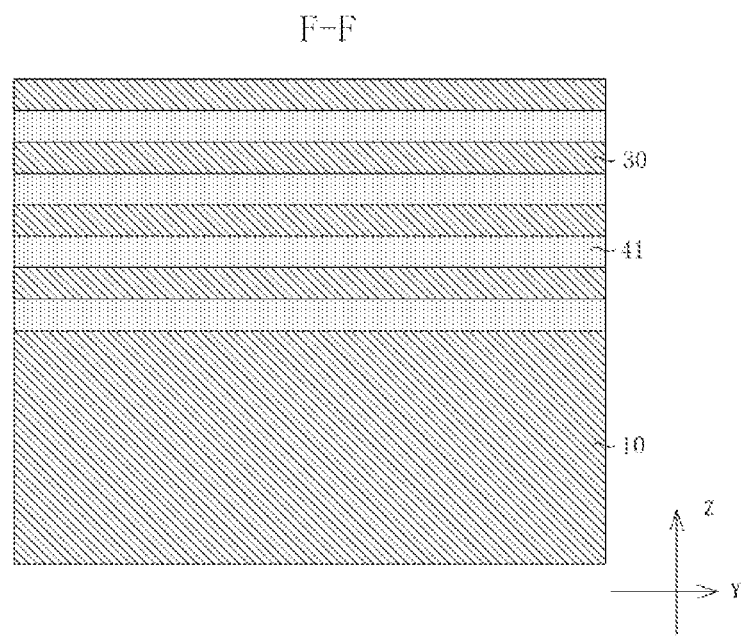
FIG. 21 is a schematic diagram of a cross section taken along F-F after the second trench is formed according to an embodiment of the present disclosure.

With reference to FIGS. 20 and 21, the plurality of second trenches 43 are formed in the stacked structure 40, and the plurality of second trenches 43 are arranged at intervals and extend along a third direction. The third direction is the horizontal direction (the direction Y) shown in FIG. 21. The third direction is parallel to the substrate 10 and perpendicular to the second direction. The second trench 43 penetrates the stacked structure 40 to expose the substrate 10.

In some possible embodiments, with reference to FIG. 20, the second trench 43 may further extend into the substrate 10, that is, the bottom of the second trench 43 is located in the substrate 10. In this way, on the one hand, it can ensure that the second trenches 43 divide the stacked structure 40 into a plurality of parts, such that each active layer 42 in the stacked structure 40 is divided into a plurality of active pillars 30 arranged at intervals, thereby improving the quantity of the active pillars 30, and increasing the storage capacity of the semiconductor structure. On the other hand, it can ensure that the second trench 43 penetrates through all the first sacrificial layers 41 to facilitate the subsequent removal of the first sacrificial layer 41.

Step S13: Remove the first sacrificial layer 41 to form a second filling space 61.

Figure 22:
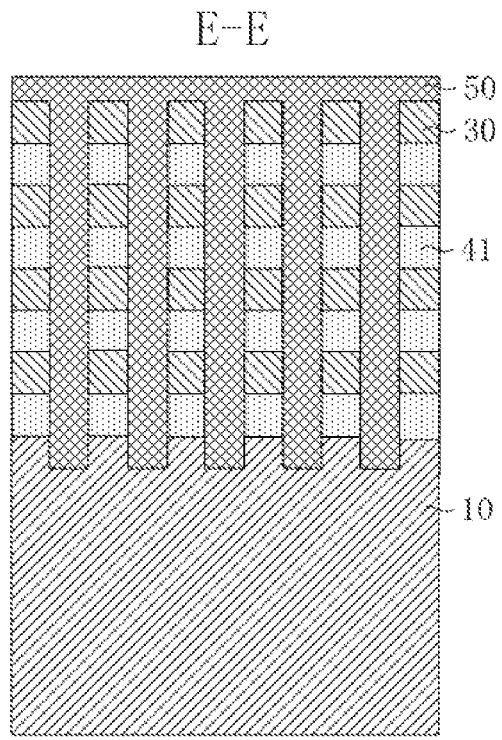
FIG. 22 is a schematic diagram of a cross section taken along E-E after a second sacrificial layer is formed according to an embodiment of the present disclosure.
Figure 23:
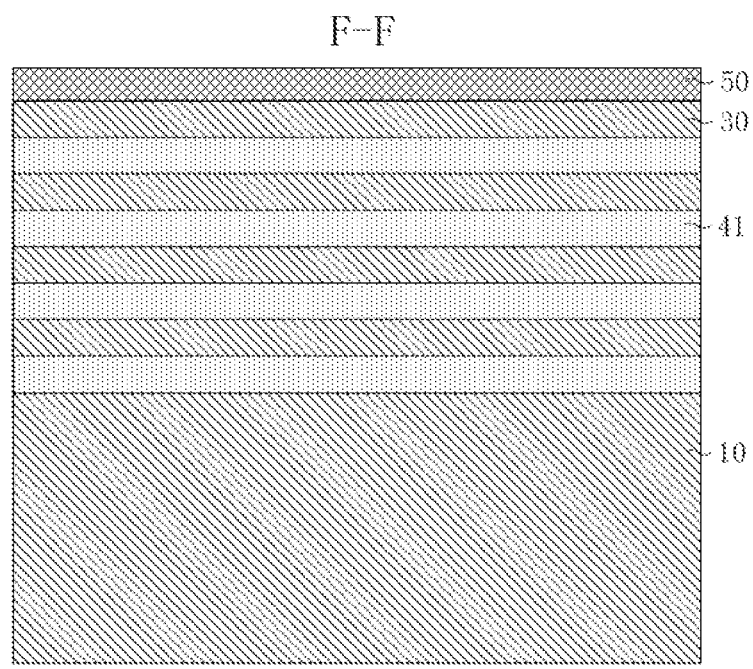
FIG. 23 is a schematic diagram of a cross section taken along F-F after the second sacrificial layer is formed according to an embodiment of the present disclosure.

With reference to FIG. 22, in some possible implementations, the step of removing the first sacrificial layer 41, to form the second filling space 61 includes:

depositing a second sacrificial layer 50 in the second trench 43 and on the stacked structure 40, where the second sacrificial layer 50 fills up the second trench 43 and covers a surface of the stacked structure 40 away from the substrate 10. As shown in FIGS. 22 and 23, the second sacrificial layer 50 fills up the second trench 43 and covers the upper surface of the stacked structure 40. After the depositing a second sacrificial layer 50 in the second trench 43 and on the stacked structure 40, where the second sacrificial layer 50 fills up the second trench 43 and covers the stacked structure 40, the method further includes: flattening the surface of the second sacrificial layer 50 away from the substrate 10, such that the upper surface of the second sacrificial layer 50 is flat for the subsequent manufacturing.

Figure 24:
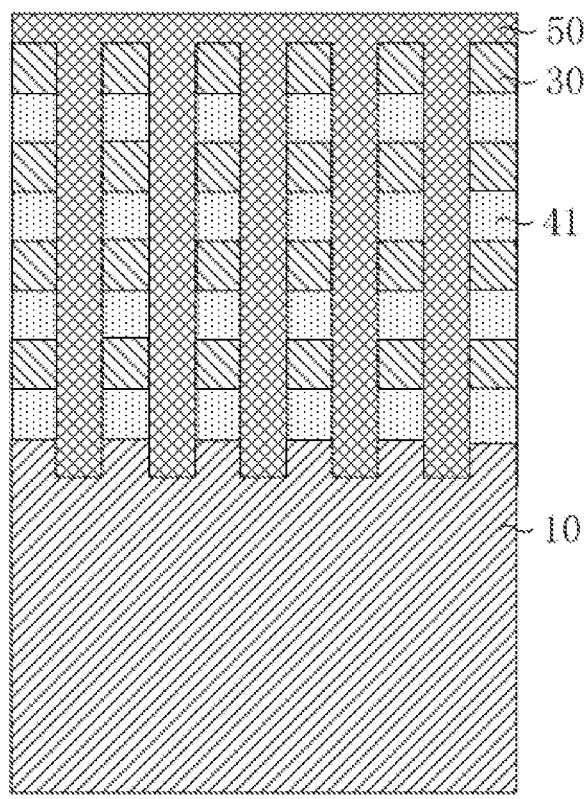
FIG. 24 is a schematic diagram of a cross section taken along E-E after a support space is formed according to an embodiment of the present disclosure.
Figure 25:
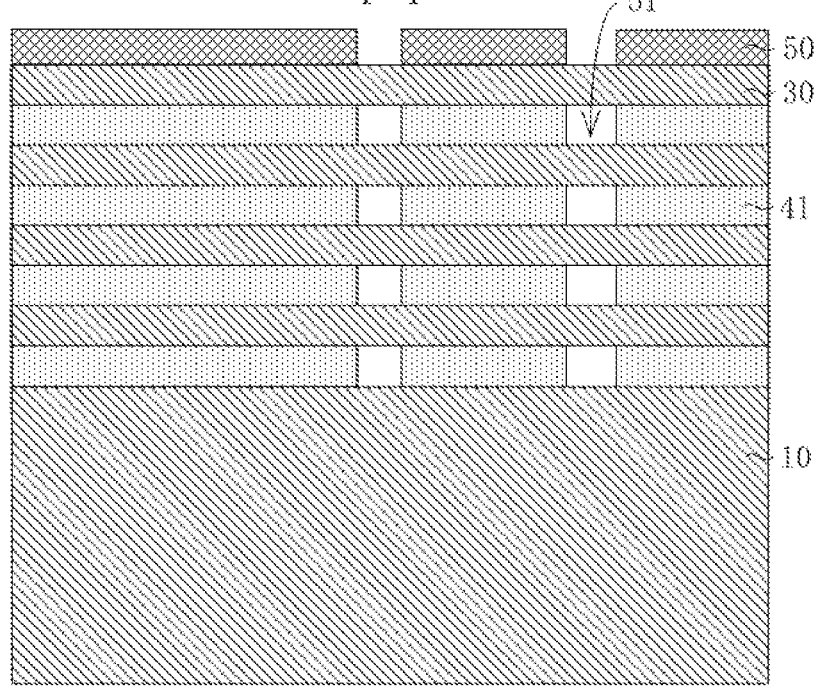
FIG. 25 is a schematic diagram of a cross section taken along F-F after the support space is formed according to an embodiment of the present disclosure.

After the second sacrificial layer 50 is formed, the second sacrificial layer 50 and the first sacrificial layer 41 are partially removed, to form at least two support spaces 51 arranged at intervals along the third direction, where the at least two support spaces 51 divide each of the active pillars 30 into a plurality of regions. With reference to FIGS. 24 and 25, for example, two support spaces 51 are provided, and can divide the active pillars 30 into three regions along the third direction. The three regions may be a BL region, a transistor region, and a capacitor region respectively, where the capacitor region is located between the two support spaces 51. Certainly, more support spaces 51 may be provided.

For example, the step of partially removing the second sacrificial layer 50 and the first sacrificial layer 41, to form at least two support spaces 51 arranged at intervals along the third direction, where the at least two support spaces 51 divide each of the active pillars 30 into the plurality of regions includes: forming a first photoresist layer on the second sacrificial layer 50, where the first photoresist layer is provided with a first pattern, and the first pattern includes at least two first etched trenches extending along the first direction; etching the second sacrificial layer 50 by the first photoresist layer as a mask, to form a plurality of etched holes arranged at intervals; and removing the first sacrificial layer 41 between two adjacent ones of the etched holes along the first direction, such that the etched holes arranged along the first direction communicate, to form the support space 51.

The first photoresist layer may be formed on the second photoresist layer through, for example, a spin coating process, and the first etched trench exposes a part of the second sacrificial layer 50. The etched hole formed by etching the second sacrificial layer 50 penetrates through the second sacrificial layer 50 and exposes the substrate 10, the active pillar 30 and the first sacrificial layer 41. The first sacrificial layer 41 can be removed by the etched hole. Specifically, the first sacrificial layer 41 exposed in the etched hole is wet-etched, such that the etched holes arranged along the first direction communicate to form a support space 51, and the support spaces 51 are arranged at intervals along the third direction.

Figure 26:
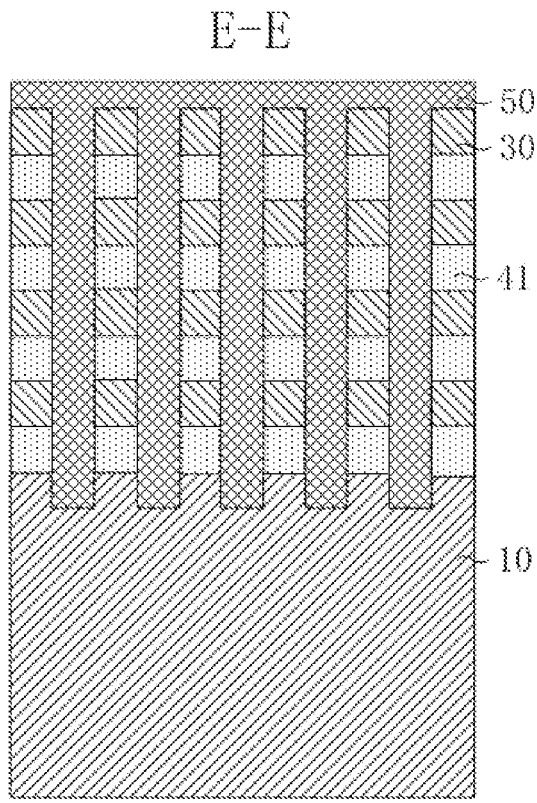
FIG. 26 is a schematic diagram of a cross section taken along E-E after a support layer is formed according to an embodiment of the present disclosure.
Figure 27:
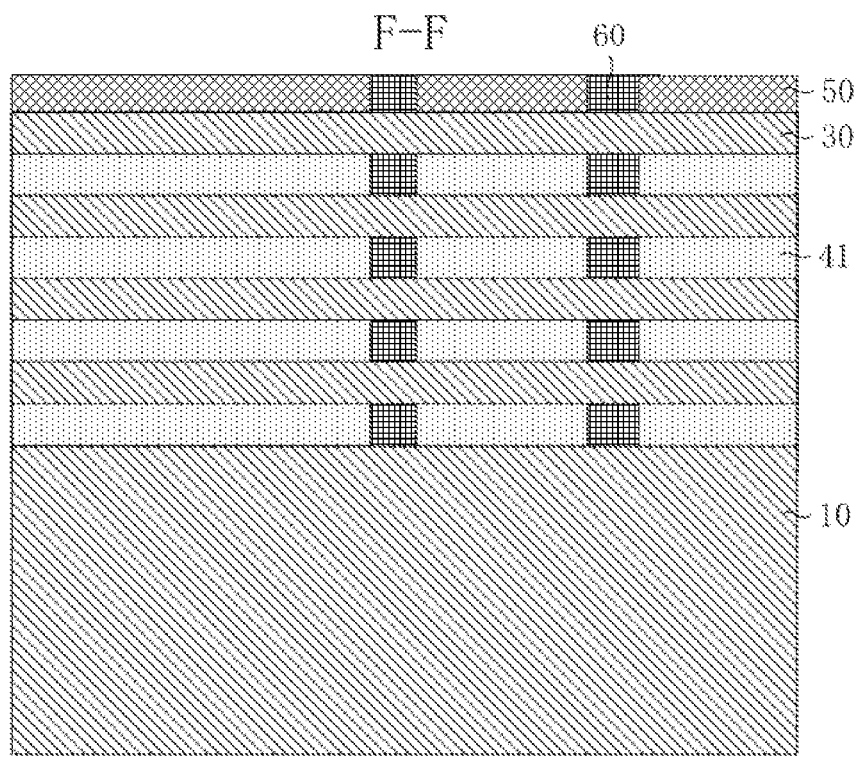
FIG. 27 is a schematic diagram of a cross section taken along F-F after the support layer is formed according to an embodiment of the present disclosure.

After the support space 51 is formed, a support layer 60 is formed in each of the support spaces 51. With reference to FIGS. 25 to 27, the support layer 60 is deposited in each filling space. The support layers 60 are arranged at intervals along the third direction, and the material of the support layer 60 may be silicon nitride. It can be understood that a plane parallel to the third direction is used as a cross section, and a cross-sectional shape of the support layer 60 is in a shape of a net.

After the support layer 60 is formed, the remaining second sacrificial layer 50 and the remaining first sacrificial layer 41 are removed to form a second filling space 61. For example, the remaining second sacrificial layer 50 is wet etched, to expose the second trench 43, and continuously, the remaining first sacrificial layer 41 is removed through the wet etching by the second trench 43, thereby forming the second filling space 61. The second filling space 61 includes the second trench 43.

Step S14: Deposit the first insulating layer 70 in the second filling space 61.

Figure 28:
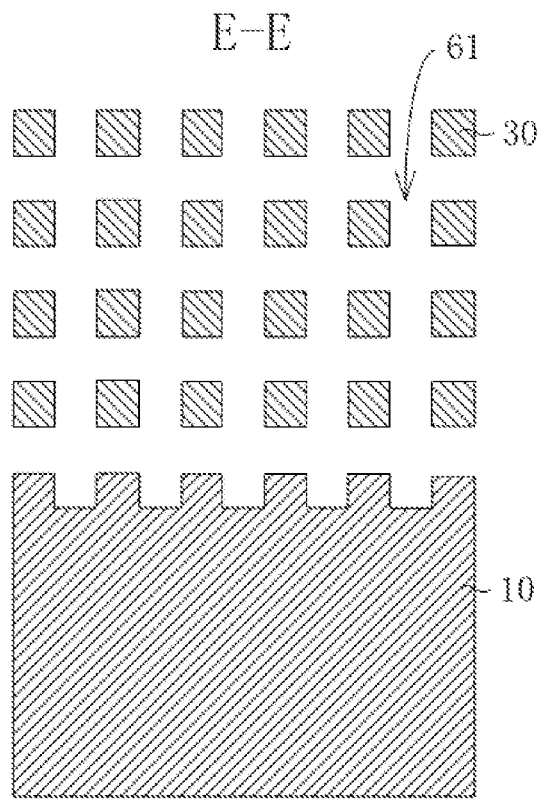
FIG. 28 is a schematic diagram of a cross section taken along E-E after a second filling space is formed according to an embodiment of the present disclosure.
Figure 29:
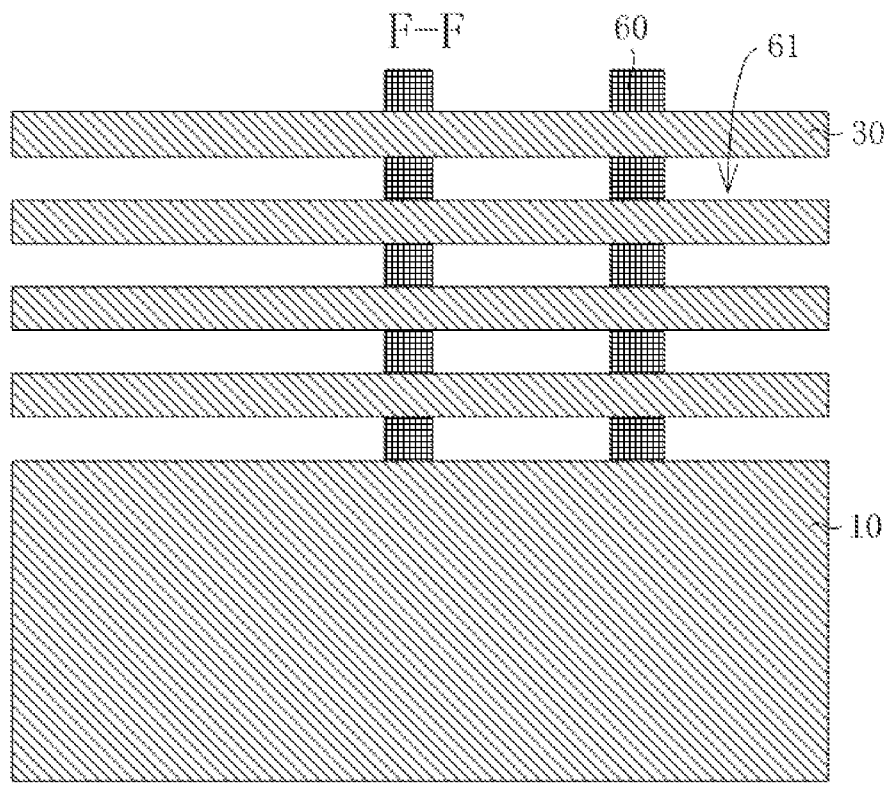
FIG. 29 is a schematic diagram of a cross section taken along F-F after the second filling space is formed according to an embodiment of the present disclosure.

With reference to FIGS. 4, 5, 28, and 29, the first insulating layer 70 fills up the second filling space 61. In some possible implementations, the step of depositing the first insulating layer 70 in the second filling space 61 includes:

depositing the first insulating layer 70 in the second filling space 61 and on the stacked structure 40, where the first insulating layer 70 fills up the second filling space 61 and covers a surface of the stacked structure 40 away from the substrate 10. As shown in FIGS. 4 and 28, the first insulating layer 70 fills up the second filling space 61 and covers the upper surface of the stacked structure 40.

The surface of the first insulating layer 70 away from the substrate 10 is flattened. As shown in FIG. 4, after the flattening processing, the surface of the first insulating layer 70 away from the substrate 10 is relatively flat, such that another structure layer is formed thereon. In addition, the active pillar 30 is not exposed. The first insulating layers 70 may be reduced or the active pillar 30 is oxidized It should be noted that, in some possible embodiments, the plurality of isolation layers 72 are each located between two same adjacent support layers 60. A gap is formed between the isolation layer 72 and the support layer 60. The step of removing at least a part of the first insulating layer 70 between adjacent isolation layers 72, to form the first filling space 73, where the first filling space 73 exposes the peripheral surface of the middle region of the active pillar 30 includes: completely removing the first insulating layer 70 between adjacent isolation layers 72 and opposite to the isolation layer 72, to form the first filling space 73.

Along the third direction, at least two support layers 60 are formed on the substrate 10. The active pillars 30 penetrate through the at least two support layers 60. In the at least two support layers 60, a plurality of isolation layers 72 are disposed between a set of two adjacent support layers 60. In some possible examples, a set of two adjacent support layers 60 are arranged along the third direction, and a plurality of isolation layers 72 are disposed between the two support layers 60. In some other possible examples, three support layers 60 are disposed along the third direction. The third support layers 60 include two sets of two adjacent support layers 60. A plurality of isolation layers 72 are disposed between one of the two sets of the support layers 60.

A gap is formed between support layers 60 at two ends of the isolation layer 72 along the third direction. In addition, the first insulating layer 70 between adjacent isolation layers 72 and opposite to the isolation layer 72 is completely removed, to form the first filling space 73. Along the third direction, the isolation layer 72 is as long as the first filling space 73.

The embodiments or implementations of this specification are described in a progressive manner, and each embodiment focuses on differences from other embodiments. The same or similar parts between the embodiments may refer to each other. In the descriptions of this specification, a description with reference to the term "one implementation", "some implementations", "an exemplary implementation", "an example", "a specific example", "some examples", or the like means that a specific feature, structure, material, or characteristic described in combination with the implementation(s) or example(s) is included in at least one implementation or example of the present disclosure. In this specification, the schematic expression of the above terms does not necessarily refer to the same implementation or example. Moreover, the described specific feature, structure, material or characteristic may be combined in an appropriate manner in any one or more implementations or examples.

Finally, it should be noted that the foregoing embodiments are used only to explain the technical solutions of the present disclosure, but are not intended to limit the present disclosure. Although the present disclosure is described in detail with reference to the foregoing embodiments, those of ordinary skill in the art should understand that they can still modify the technical solutions described in the foregoing embodiments, or make equivalent substitutions on some or all technical features therein. The modifications or substitutions do not make the essence of the corresponding technical solutions deviate from the scope of the technical solutions of the embodiments of the present disclosure.

The invention claimed is:

1. A manufacturing method of a semiconductor structure, comprising:

forming a first insulating layer on a substrate, wherein a plurality of active pillars are arranged at intervals along a first direction and a second direction in the first insulating layer, and the plurality of active pillars extend along a third direction;

partially removing the first insulating layer, to form a plurality of first trenches extending along the third direction, wherein each of the first trenches exposes the substrate, and is located between two adjacent columns of active pillars along the first direction;

forming an isolation layer in each of the first trenches;

removing at least a part of the first insulating layer between adjacent isolation layers, to form a first filling space, wherein the first filling space exposes a peripheral surface of a middle region of each of the plurality of active pillars; and forming a gate structure on the peripheral surface of the active pillar exposed in the first filling space, wherein the gate structures are integrated along the second direction;

forming a protective layer on the gate structure, the first insulating layer, and the isolation layer, and forming a second insulating layer on the protective layer;

etching the second insulating layer and the protective layer, to form a plurality of word line (WL) plug holes arranged at intervals, wherein each of the WL plug holes exposes one of the gate structures; and forming a WL plug in each of the WL plug holes, wherein the WL plugs are electrically connected to the gate structures in a one-to-one correspondence.

2. The manufacturing method according to claim 1, wherein the forming the first insulating layer on the substrate, wherein the plurality of active pillars are arranged at intervals along the first direction and the second direction in the first insulating layer, and the plurality of active pillars extend along the third direction comprises:

forming a stacked structure on the substrate, wherein the stacked structure comprises a first sacrificial layer and an active layer that are disposed alternately along the second direction;

etching the stacked structure, to form a plurality of second trenches arranged at intervals and extending along the third direction, wherein the second trenches expose the substrate, and divide the active layer into the plurality of active pillars;

removing the first sacrificial layer, to form a second filling space; and depositing the first insulating layer in the second filling space.

3. The manufacturing method according to claim 2, wherein the removing the first sacrificial layer, to form the second filling space comprises:

depositing a second sacrificial layer in the second trench and on the stacked structure, wherein the second sacrificial layer fills up the second trench and covers a surface of the stacked structure away from the substrate;

partially removing the second sacrificial layer and the first sacrificial layer, to form at least two support spaces arranged at intervals along the third direction, wherein the at least two support spaces divide each of the active pillars into a plurality of regions;

forming a support layer in each of the support spaces; and removing the remaining second sacrificial layer and the remaining first sacrificial layer, to form the second filling space.

4. The manufacturing method according to claim 3, after the depositing the second sacrificial layer in the second trench and on the stacked structure, wherein the second sacrificial layer fills up the second trench and covers a surface of the stacked structure away from the substrate, the manufacturing method further comprises:
- flattening a surface of the second sacrificial layer away from the substrate.

5. The manufacturing method according to claim 3, wherein the partially removing the second sacrificial layer and the first sacrificial layer, to form at least two support spaces arranged at intervals along the third direction, wherein the at least two support spaces divide each of the active pillars into a plurality of regions comprises:
- etching the second sacrificial layer to form a plurality of etched holes arranged at intervals; and
- removing the first sacrificial layer between two adjacent ones of the etched holes along the first direction, such that the etched holes arranged along the first direction communicate, to form the support space.

6. The manufacturing method according to claim 3, wherein a plurality of isolation layers are each located between two same adjacent ones of the support layers, and a gap is formed between the isolation layer and the support layer; and
- the removing at least a part of the first insulating layer between adjacent isolation layers, to form a first filling space, wherein the first filling space exposes a peripheral surface of a middle region of the active pillar comprises:
- completely removing the first insulating layer between adjacent isolation layers and opposite to the isolation layer, to form the first filling space.

7. The manufacturing method according to claim 2, wherein the depositing the first insulating layer in the second filling space comprises:
- depositing the first insulating layer in the second filling space and on the stacked structure, wherein the first insulating layer fills up the second filling space and covers a surface of the stacked structure away from the substrate; and
- flattening a surface of the first insulating layer away from the substrate.

8. The manufacturing method according to claim 2, wherein a material of the first sacrificial layer comprises silicon germanium, and a material of the active layer comprises N-type doped silicon.

9. The manufacturing method according to claim 2, wherein the first sacrificial layer and the active layer are formed through an epitaxial growth process.

10. The manufacturing method according to claim 2, wherein an innermost layer in the stacked structure close to the substrate is the first sacrificial layer, and an outermost layer in the stacked structure away from the substrate is the active layer.

11. The manufacturing method according to claim 1, wherein the forming the isolation layer in each of the first trenches comprises:
- depositing the isolation layer in each of the first trenches and on the first insulating layer, wherein the isolation layer fills up the first trench and covers a surface of the first insulating layer away from the substrate; and
- flattening a surface of the isolation layer away from the substrate, to expose the first insulating layer.

12. The manufacturing method according to claim 1, wherein the forming the gate structure on the peripheral surface of the active pillar exposed in the first filling space, wherein the gate structures are integrated along the second direction comprises:
- forming a gate dielectric layer on the peripheral surface of the active pillar, wherein gaps are formed between the gate dielectric layers and between the gate dielectric layer and the isolation layer; and
- forming a gate conductive layer in the remaining first filling space, and taking the gate dielectric layer and the gate conductive layer as the gate structure.

13. The manufacturing method according to claim 1, wherein a material of the isolation layer comprises silicon nitride or silicon oxynitride.

14. A semiconductor structure, formed by the manufacturing method according to claim 1.

* * * * *